(12) United States Patent
Gaku et al.

(10) Patent No.: US 6,280,641 B1
(45) Date of Patent: Aug. 28, 2001

(54) PRINTED WIRING BOARD HAVING HIGHLY RELIABLY VIA HOLE AND PROCESS FOR FORMING VIA HOLE

(75) Inventors: Morio Gaku; Nobuyuki Ikeguchi; Yasuo Tanaka, all of Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/321,556

(22) Filed: May 28, 1999

(30) Foreign Application Priority Data

| Jun. 2, 1998 | (JP) | ................................. 10-169269 |
| Jun. 2, 1998 | (JP) | ................................. 10-169270 |
| Jul. 28, 1998 | (JP) | ................................. 10-227694 |
| Dec. 14, 1998 | (JP) | ................................. 10-375343 |

(51) Int. Cl.$^7$ .............................. H05K 3/00; H05K 3/42; H05K 3/46
(52) U.S. Cl. ................................ 216/17; 216/18; 216/65; 216/78; 219/121.71; 29/846; 29/852; 427/97
(58) Field of Search ................................ 216/17, 18, 65, 216/67, 78; 29/846, 847, 852; 219/121.61, 121.7, 121.71; 427/96, 97, 98, 534, 554, 555

(56) References Cited

U.S. PATENT DOCUMENTS

| 4,258,468 | | 3/1981 | Balde ..................... 29/830 |
| 4,717,639 | * | 1/1988 | Dubin et al. ................ 216/17 |
| 5,063,280 | | 11/1991 | Inagawa et al. ........... 219/121.7 |
| 5,073,687 | * | 12/1991 | Inagawa et al. ........... 219/121.7 |
| 5,121,298 | * | 6/1992 | Sarma et al. ............... 361/406 |
| 5,648,125 | * | 7/1997 | Cane ....................... 427/534 |
| 6,117,706 | * | 9/2000 | Yoshioka et al. ........... 438/106 |

FOREIGN PATENT DOCUMENTS

| 31 03 986 | | 9/1982 | (DE) . |
| 0 668 712 | | 8/1995 | (EP) . |
| 1450874A | * | 9/1965 | (FR) . |
| 2 307 108 | | 5/1997 | (GB) . |
| 10-6298 A | * | 1/1998 | (JP) . |
| 98/20533 | | 5/1998 | (WO) . |

OTHER PUBLICATIONS

Ray, IBM Technical Disclosure Bulletin, vol. 26, No. 7B, pp. 3586–3587, Dec. 1983, XP002157888.
Kestenbaum et al., IEEE Transactions on Components, Hybrids, and Manufacturing Technology, vol. 13, No. 4, pp. 1055–1062, Dec. 1990, XP000176849.
Patent Abstracts of Japan, vol. 017, No. 386 (E–1401), Jul. 20, 1993 (JP 05 067882A).
Patent Abstracts of Japan, vol. 1997, No. 11, Nov. 28, 1997 (JP 09 199861A).
Patent Abstracts of Japan, vol. 1998, No. 5, Apr. 30, 1998 (JP 10 004272A).
Patent Abstracts of Japan, vol. 1998, No. 5, Apr. 30, 1998 (JP 10 022644A).

\* cited by examiner

*Primary Examiner*—Randy Gulakowski
*Assistant Examiner*—Saeed Chaudhry
(74) *Attorney, Agent, or Firm*—Wenderoth, Lind & Ponack, L.L.P.

(57) ABSTRACT

Disclosed are a printed wiring board having micro-via holes highly reliable for conduction and a method of making the micro-via hole by providing a coating or sheet of an organic substance containing 3 to 97% by volume of at least one selected from a metal compound powder, a carbon powder or a metal powder having a melting point of at least 900° C. and a bond energy of at least 300 kJ/mol on a copper foil as an outermost layer of a copper-clad laminate having at least two copper layers, or providing a coating or sheet of the same after oxidizing a copper foil as an outermost layer, irradiating the coating or sheet with a carbon dioxide gas laser at an output of 20 to 60 mJ/pulse, thereby removing a micro-via-hole-forming portion of at least the copper foil as the outermost layer, then irradiating micro-via-hole-forming portions of the remaining layers with a carbon dioxide gas laser at an output of 5 to 35 mJ/pulse to make a micro-via hole which does not penetrate through the copper foil in a bottom of the micro-via hole, and electrically connecting the copper foil as the outermost layer and the copper foil in the bottom of the micro-via hole with a metal plating or an electrically conductive coating composition.

16 Claims, 10 Drawing Sheets

(4)

(5)

h (1)

(2)

(4)

k (4)

o (5)

n (1)

(2)

(3)

(4)

(1)

(2)

PRINTED WIRING BOARD HAVING HIGHLY RELIABLY VIA HOLE AND PROCESS FOR FORMING VIA HOLE

FIELD OF THE INVENTION

The present invention relates to a printed wiring board having a micro-via hole. More specifically, it relates to a printed wiring board having a structure in which a micro-via hole is formed by removing part of surface of a copper foil positioned below an outermost layer, i.e., a surface layer, so as not to penetrate through the copper foil in the bottom, and the surface layer and the copper foil are electrically connected with a plating or an electrically conductive coating composition forming a wall surface of the micro-via hole, the printed wiring board being highly reliable with regard to conduction and being mainly for use for a small-sized semiconductor plastic package.

PRIOR ART OF THE INVENTION

In a high-density multi-layered printed wiring board for use in a semiconductor plastic package, conventionally, a via hole is made directly with a mechanical drill, or it is made by removing a hole-forming portion of a surface-layer copper foil by etching and then making a hole in an insulation layer with a carbon dioxide gas laser. When a mechanical drill is used, it is difficult to make a via hole discontinued in a middle of an intended inner-layer copper foil in its thickness direction if the inner-layer copper foil has a small thickness or if a multi-layered board varies in thickness. In some cases, the via hole goes through the intended inner-layer copper foil and reaches a copper foil layer below the inner-layer copper foil, which causes a failure in function. When a carbon dioxide gas laser is used, a resin layer having approximately 1 µm remains on a wall surface of a micro-via hole and on a copper foil surface forming a bottom of the micro-via hole, and it is therefore required to carry out desmear treatment before copper-plating. When a micro-via hole has a small diameter or when the desmear treatment is insufficient due to insufficient contact of a desmearing liquid to inner surfaces of a micro-via hole, the adhesion of a copper plating to a micro-via hole bottom is defective, which results in poor reliability in conduction. That is, a conduction failure often takes place since the conduction between a surface-layer copper foil and a copper foil in a bottom or a wall surface of a micro-via hole is poor. Moreover, there is another problem that the above desmear treatment requires a time period 2 to 3 times the time period of desmear treatment for a general through hole, which causes poor workability.

Further, when a copper foil surface is directly irradiated with a carbon dioxide gas laser, laser beam is reflected and no hole is made in the copper foil. Conventionally, therefore, a predetermined size of a hole-making portion of a surface-layer copper foil is removed by etching, and an exposed resin portion is irradiated with a low-output carbon dioxide gas laser to make a via hole. When a hole having a small diameter of 100 µm or less is made in a copper foil by etching, there is caused a problem that the hole has poor diameter accuracy if the copper foil has a large thickness.

Furthermore, when a copper foil is present as an inner layer, even if a hole is made in a surface-layer copper foil with low energy after the concerned portion of the surface-layer copper foil is removed by etching, no hole can be made in the inner-layer copper foil, or the intended micro-via hole having a copper layer on its wall surface cannot be formed.

SUMMARY OF THE INVENTION

It is an object of the present invention to provide a printed wiring board having a highly reliable micro-via hole electrically connecting a copper foil on an outermost layer to a copper foil positioned in the bottom of the micro-via hole, and a method of forming the above micro-via hole.

It is another object of the present invention to provide a printed wiring board having a highly reliable micro-via hole electrically connecting a copper foil on an outermost layer to a copper foil positioned in the bottom of the micro-via hole through a copper foil exposed on a wall surface of the micro-via hole, and a method of forming the above micro-via hole.

It is still further another object of the present invention to provide a printed wiring board having a small-diameter micro-via hole formed without any desmear treatment and a method of forming the micro-via hole having the above characteristic.

It is yet another object of the present invention to provide a printed wiring board having a micro-via hole that can be formed at a high rate and a method of forming the micro-via hole having the above characteristic.

According to the present invention, the above objects of the present invention are achieved by the following (1) to (8).

(1) A printed wiring board having a micro-via hole electrically connecting a first copper foil as an outermost layer to a copper foil positioned below the first copper foil, the micro-via hole electrically connecting the outermost layer to the copper foil in a bottom of the micro-via hole with a plating or an electrically conductive coating composition, the micro-via hole not penetrating through the copper foil in the bottom of the micro-via hole when formed by removing part of the copper foil in a bottom portion of the micro-via hole with a carbon dioxide gas laser.

(2) A method of making a micro-via hole for electrically connecting a first copper foil as an outermost layer of a printed wiring board to a copper foil in a bottom of the micro-via hole with a carbon dioxide gas laser, the method comprising providing a coating or sheet of an organic substance containing 3 to 97% by volume of at least one selected from a metal compound powder, a carbon powder or a metal powder having a melting point of at least 900° C. and a bond energy of at least 300 kJ/mol on a copper foil as an outermost layer of a copper-clad laminate having at least two copper layers, irradiating the coating or sheet with a carbon dioxide gas laser at an output of 20 to 60 mJ/pulse, thereby removing a micro-via-hole-forming portion of at least the copper foil as the outermost layer, then irradiating micro-via-hole-forming portions of the remaining layers with a carbon dioxide gas laser at an output of 5 to 35 mJ/pulse to make a micro-via hole which does not penetrate through the copper foil in a bottom of the micro-via hole, and electrically connecting the copper foil as the outermost layer and the copper foil in the bottom of the micro-via hole with a metal plating or an electrically conductive coating composition.

(3) A method according to the above (2), wherein, after the removal of the micro-via-hole-forming portion of the copper foil as the outermost layer with the carbon dioxide gas laser, the copper foil positioned below the first copper foil is removed partly in the thickness direction thereof with the carbon dioxide gas laser at an output of 20 to 35 mJ/pulse.

(4) A method according to the above (2), wherein the first copper foil as the outermost layer is surface-etched to decrease the first copper foil partly in the thickness direction of the first copper foil and at the same time to remove a copper foil burr.

(5) A method according to the above (2), wherein part of the copper foil surface in the bottom of the micro-via hole is removed and then an inside of the micro-via hole is treated in a gaseous phase to remove remaining resin layer, followed by wetting treatment.

(6) A method according to the above (5), wherein the remaining resin is removed by the treatment in a gaseous phase and the wetting treatment.

(7) A method according to the above (5), wherein the treatment in a gaseous phase is plasma treatment or low-pressure ultraviolet light treatment.

(8) A method according to the above (2), wherein the first copper foil and the copper foil layer in the bottom of the micro-via hole are electrically connected by filling at least 80% by volume of the micro-via hole with a copper plating.

DETAILED DESCRIPTION OF THE INVENTION

Figure 1:
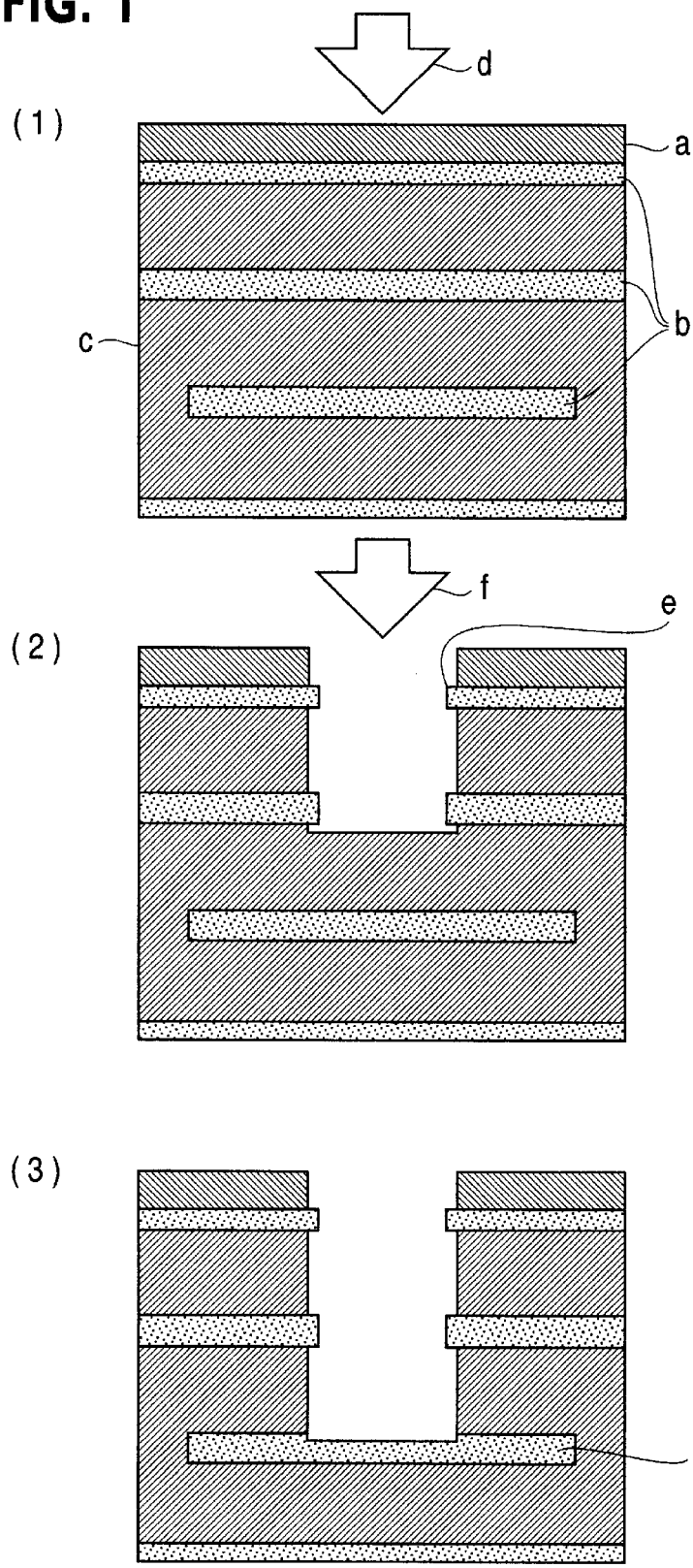
FIG. 1 shows the steps of making a micro-via hole with a carbon dioxide gas laser in Example 2 [(1), (2) and (3)].

In the drawings, symbols have the following meanings. a: metal-powder-containing resin layer, b: copper foil, c: layer of glass cloth substrate and thermosetting resin, d: high-output carbon dioxide gas laser, e: copper foil burr, f: low-output carbon dioxide gas laser, g: copper foil surface layer in the bottom of micro-via hole, h: copper plating portion of micro-via hole, i: mechanical drill, j: micro-via hole penetrating through copper foil as a lowermost layer, k: portion where micro-via hole penetrates through copper foil as an inner layer due to high-output carbon dioxide gas laser, l: micro-via hole made with carbon dioxide gas laser, m: micro-via hole subjected to gaseous phase treatment and wetting treatment, n: copper plating filled in micro-via hole portion, o: copper foil etched by SUEP method, p: copper plating on micro-via hole portion which penetrates through an inner layer.

According to the present invention, there is provided a printed wiring board having a micro-via hole electrically connecting a first copper foil as an outermost layer (to be also referred to as "surface layer" hereinafter) to a copper foil positioned below the first copper foil, the micro-via hole electrically connecting the outermost layer to the copper foil in a bottom of the micro-via hole with a plating or an electrically conductive coating composition, the micro-via hole not penetrating through the copper foil in the bottom of the micro-via hole when formed by removing part of the copper foil in a bottom portion of the micro-via hole with a carbon dioxide gas laser.

The micro-via hole in the present invention is formed as follows. Oxidation treatment to form a metal is carried out on at least a carbon-dioxide-gas-laser-irradiation surface of a copper foil surface of a double-side copper-clad laminate or a multi-layered board, or at least the above carbon-dioxide-gas-laser irradiation surface is provided with a coating or a sheet formed of a metal compound having a melting point of at least 900° C. and a bond energy of at least 300 kJ/mol, a carbon powder or a mixture of at least one metal powder with an organic material, a hole is made in the copper foil as a surface layer with pulse oscillation of a carbon dioxide gas laser with an energy of 20 to 60 mJ/pulse, and part of a copper foil layer as an inner layer immediately below the above copper foil or the other outer copper foil surface of the double-side copper-clad laminate is processed with an energy of 20 to 35 mJ/pulse such that the copper foil layer is not penetrated through, whereby a micro-via hole having an interior of the copper foil layer newly exposed is formed.

Otherwise, the micro-via hole can be formed as follows. A micro-via-hole-forming portion of a copper foil as a surface layer is removed by etching in advance, and a resin layer portion where copper is removed by etching is processed with a carbon dioxide gas laser, and a copper foil layer positioned below the above processed portion is processed with a carbon dioxide gas laser at an output of 20 to 35 mJ/pulse such that the copper foil layer is not penetrated through, whereby a micro-via hole having an interior of the copper foil layer newly exposed is formed.

When the copper foil in the bottom of a micro-via hole is processed without cutting part of the surface thereof, a resin layer having a thickness of approximately 1 μm remains in the bottom of the micro-via hole. In this case, preferably, plasma treatment or low-pressure ultraviolet light treatment is carried out to remove the resin layer, and then wetting treatment by desmear treatment, etc., is carried out before copper plating.

Then, the copper foil surface is treated by mechanical polishing or with a chemical solution. The treatment with a chemical treatment is carried out so as not to dissolve and remove copper foil in a micro-via hole portion when a micro-via hole is made in a double-side copper-clad laminate.

When a micro-via hole is made by direct irradiation with a carbon dioxide gas laser, a copper foil burr occurs in a micro-via hole portion of a copper foil as a surface layer. Such a burr it difficult to remove by mechanical polishing, and it is therefore preferred to remove the bur with a chemical solution. The surface of each copper foil is two-dimensionally etched to decrease the thickness thereof, whereby the copper foil burr in the micro-via hole portion is removed. The copper foil thickness therefore decreases. In forming a circuit of a narrow line on the copper foil obtained by metal plating on each surface, therefore, defects such as a short circuit and a pattern breakage do not take place, and a high-density printed wiring board can be produced.

Further, no desmear treatment is required, and good workability is accomplished. When the outermost layer and an inner layer below it are connected with a metal plating or an electrically conductive coating composition, large connection areas are secured, and the so-obtained printed wiring board is highly reliable in connection (conduction).

The present invention is concerned with a printed wiring board comprising a double-side copper-clad laminate having at least two copper layers or a multi-layered board and a micro-via hole made therein, and a method of making the above micro-via hole.

The method of making a micro-via hole is as follows. A copper foil as a surface layer is oxidation-treated to form a metal oxide, a resin composition containing 3 to 97% by volume of at least one selected from a metal compound powder, a carbon powder or a metal powder having a melting point of at least 900° C. and a bond energy of at least 300 kJ/mol is applied to a copper foil as a surface layer, or a sheet of such a composition is placed on a copper foil as a surface layer, the metal oxide, the coating or the sheet is irradiated with a high-output carbon dioxide gas laser at an output of 20 to 60 mJ/pulse, to form a hole in the copper foil as a surface layer, then part of an inner layer positioned below the above copper foil or the other copper foil surface of a double-side copper-clad laminate is irradiated with a carbon dioxide gas laser at an output of 25 to 35 mJ/pulse to make a micro-via hole which does not penetrate through the copper foil in a bottom of the micro-via hole, whereby the micro-via hole has an interior of the copper foil layer newly exposed is formed.

There may be employed an embodiment in which the copper foil is processed with an energy of 20 to 60 mJ/pulse, the copper foil in the bottom of the micro-via hole is finally processed with an energy of 5 to 35 mJ/pulse, a remaining resin layer is removed by gaseous phase treatment such as plasma or low-pressure ultraviolet treatment, then, wetting treatment is carried out, and copper plating is carried out. Naturally, desmear treatment may be carried out, while the gaseous phase treatment is more suitable for completely removing he remaining resin when the micro-via hole has a small diameter.

Further, copper foil is pre-removed from a micro-via-hole-forming portion of a copper foil as a surface layer by etching, and a resin is processed with a low-output carbon dioxide gas laser. Then, a copper foil positioned below the resin is processed with a carbon dioxide gas laser at an output of 20 to 35 mJ/pulse such that the copper foil is not penetrated through, to make a micro-via hole having an interior of the copper foil exposed.

Then, a copper foil surface is mechanically polished or treated with a chemical solution. For the mechanical polishing, a general polishing machine may be used. When a micro-via hole portion has a burr, it is required to carry out the polishing several times, which may result in a change in dimensions of the board. It is therefore preferred to employ a copper foil surface treatment method in which etching with a chemical solution and the removal of a burr by dissolving it with the chemical solution are carried out at the same time.

The surfaces of each copper foil is two-dimensionally etched to decrease the thickness thereof until the copper foil generally has a thickness 3 to 7 $\mu$m each. In forming a circuit of a narrow line on the copper foil obtained by metal plating on each surface, therefore, defects such as a short circuit and a pattern breakage do not take place, and a high-density printed wiring board can be produced. Further, the micro-via hole in the present invention requires no desmear treatment, and good workability is accomplished. The copper foil in the bottom of the micro-via hole is exposed to a great extent, and when the micro-via hole portion is plated with a metal or filled with an electrically conductive coating composition to connect the outermost layer to a copper foil positioned below it, a large connection area can be obtained, and there can be obtained a printed wiring board having high reliability in connection through the micro-via hole. A known chemical solution can be used as such for the etching. For example, such chemicals are disclosed in JP-A-02-22887, JP-A-02-22896, JP-A-02-25089, JP-A-02-25090, JP-A-02-60189, JP-A-02-166789, JP-A-03-25995, JP-A-03-60183, JP-A-03-94491, JP-A-04-199592 and JP-A-04-263488. The etching is carried out by a method (called SUEP method) in which a metal surface is dissolved and removed with the above chemical. The etching rate is generally set at 0.02 to 1.0 $\mu$m/second.

The double-side copper-clad laminate or multi-layered board having at least 2 copper layers, used in the present invention, is preferably a double-side copper-clad laminate produced by providing a glass cloth as a substrate, incorporating a dye or a pigment into a thermosetting resin composition to color it in black, and mixing 10 to 60% of an inorganic insulating filler with the resin composition, forming a homogeneous mixture and impregnating the glass cloth with the mixture.

The multi-layered board is preferably a product produced by processing the above double-side copper-clad laminate using a glass cloth as a substrate, providing the processed double-side copper-clad laminate as an inner layer, oxidizing the surfaces thereof to form a copper oxide layer as required, placing an inorganic or organic cloth-based prepreg, a resin sheet, a resin-attached copper foil or a coating of a coating composition on each surface and laminate-forming the resultant set under heat and pressure and preferably under vacuum.

Besides the above copper-clad boards, there may be used a double-side copper-clad laminate and a multi-layered board using a generally known highly heat-resistant film such as a polyimide film, a polyester film, a polyparaffinic acid film or the like.

The substrate includes generally known inorganic or organic woven fabric and non-woven fabric. Specifically, the inorganic substrate is selected from woven and non-woven fabrics formed of E, S, D and M glass fibers. The organic substrate is selected from woven and non-woven fabric formed of liquid crystal polyester and wholly aromatic polyamide fibers.

The resin for the thermosetting resin composition used in the present invention is generally selected from known thermosetting resins. Specific examples thereof include an epoxy resin, a polyfunctional cyanate ester resin, a polyfunctional maleimide-cyanate ester resin, a polyfunctional maleimide resin, and an unsaturated-group-containing polyphenylene ether resin. These resins may be used alone or in combination. In view of the form of a micro-via hole or through hole formed by processing with a high-output carbon dioxide gas laser, a thermosetting resin composition having a glass transition temperature of at least 150° C. is preferred. In view of humidity resistance, anti-migration properties and electric characteristics after moisture absorption, a polyfunctional cyanate ester resin composition is preferred.

The polyfunctional cyanate ester compound which is a thermosetting resin component in the present invention is a compound having a molecule containing at least 2 cyanato groups. Specific examples thereof include 1,3- or 1,4-dicyanatobenzene, 1,3,5-tricyanotobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis(4-cyanatophenyl) propane, 2,2-bis(3,5-dibromo-4-cyanatophenyl)propane, bis (4-cyanatophenyl)ether, bis(4-cyanatophenyl)thioether, bis (4-cyanotophenyl)sulfone, tris(4-cyanatophenyl)phosphite, tris(4-cyanatophenyl)phosphite and cyanates obtained by a reaction between novolak and cyan halide.

Further, there may be used polyfunctional cyanate ester compounds disclosed in Japanese Patent Publications Nos. 41-1928, 42-18468, 44-4791, 45-11712, 46-41112 and 47-26853 and JP-A-51-63149. Furthermore, there may be used a prepolymer having a molecular weight of 400 to 6,000 and having a triazine ring formed by dimerizing cyanato group of any one these polyfunctional cyanate ester compounds. The prepolymer is obtained by polymerizing the above polyfunctional cyanate ester monomer in the presence of an acid such as a mineral acid or a Lewis acid, a base such as tertiary amine, e.g., sodium alcoholate, or a salt such as sodium carbonate. The prepolymer partially contains unreacted monomer and is in the form of a mixture of a monomer and a prepolymer, and it is also suitably used in the present invention. Generally, it is dissolved in an organic solvent in which it is soluble, before use.

The epoxy resin is generally selected from known epoxy resins. Specific examples thereof include a liquid or solid bisphenol A type epoxy resin, a bisphenol F type epoxy resin, a phenol novol,ak type epoxy resin, a cresol novolak type epoxy resin, an alicyclic epoxy resin, a polyepoxy compound obtained by epoxidizing the double bond of butadiene, pentadiene, vinylcyclohexene or dicyclopentyl ether, a polyol, and a polyglycidyl compound obtained by a reaction between a hydroxyl-group-containing silicone resin and epohalohydrin. These resins may be used alone or in combination.

The polyimide resin is generally selected from known polyimide resins. Preferably, a polyimide resin is suitably used in combination in view of a balance in characteristics.

Various additives may be added to the thermosetting resin composition in the present invention so long as the inherent properties of the composition are not impaired. The above additives include monomers having polymerizable double bonds such as unsaturated polyester, prepolymers of these, liquid elastic rubbers having a low molecular weight or elastic rubbers having a high molecular weight such as polybutadiene, epoxidized butadiene, maleated butadiene, a butadiene-acrylonitrile copolymer, polychloroprene, a butadiene-styrene copolymer, polyisprene, butyl rubber, fluorine rubber and natural rubber, polyethylene, polypropylene, polybutene, poly-4-methylpentene, polystyrene, AS resin, ABS resin, MBS resin, styrene-isoprene rubber, a polyethylene-propylene copolymer, a 4-fluoroethylene-6-fluoroethylene copolymer, high-molecular-weight prepolymers or oligomers such as polycarbonate, polyphenylene ether, polysulfone, polyester and polyphenylene sulfide, and polyurethane. These additives are used as required. Further, various known additives such as an organic filler, a thickener, a lubricant, an anti-foamer, a dispersing agent, a leveling agent, a photo-sensitizer, a flame retardant, a brightener, a polymerization inhibitor and a thixotropic agent may be used alone or in combination as required. A curing agent or a catalyst is incorporated into a compound having a reactive group as required.

The thermosetting resin composition in the present invention undergoes curing itself under heat. Since, however, its curing rate is low and is therefore poor in workability and economic performances, etc., a known heat-curing catalyst is incorporated into the thermosetting resin. The amount of the catalyst per 100 parts by weight of the thermosetting resin is 0.005 to 10 parts by weight, preferably 0.01 to 5 parts by weight.

The inorganic insulating filler can be selected from generally know fillers. Specific examples thereof include silicas such as natural silica, calined silica and amorphous silica, white carbon, titanium white, aerogel, clay, talc, wollatonite, natural mica, synthetic mica, kaolin, magnesia, alumina and perlite. The amount of the above filler is 10 to 60% by weight, preferably 15 to 50% by weight.

Further, it is preferred to add a black dye or pigment to the resin composition for preventing the scattering of laser beam during the irradiation with a carbon dioxide gas laser. The particle diameter of the black dye or pigment is preferably 1 $\mu$m or less for forming a uniform dispersion. The dye or pigment can be selected from generally known dyes or pigments. The amount thereof is preferably 0.1 to 10% by weight. Further, there may be used a glass fiber of which the fiber surface is dyed in black.

The copper foil for use as the outermost layers can be selected from generally known copper foils. Preferably, an electrolytic copper foil having a thickness of 3 to 18 $\mu$m is used. As a copper foil for use as an inner layer, an electrolytic copper foil having a thickness of 12 to 70 $\mu$m is preferably used.

A reinforced glass-cloth-substrate copper-clad laminate is prepared by impregnating the glass substrate with the thermosetting resin composition, drying the composition to B-stage the composition, to obtain a prepreg having a glass content of 30 to 85% by weight, then laminating a predetermined number of sheets of the so-obtained prepreg, placing copper foils on the upper and lower surfaces of the laminated prepreg, one on each surface, and laminate-forming the resultant set under heat and pressure, to obtain a double-side copper-clad laminate. The so-obtained copper-clad laminate has a cross section where the resin and the inorganic filler other than the glass are homogeneously dispersed, and a hole can be uniformly formed with a laser. Further, the copper-clad laminate is colored in a black, it is easier to make a uniform hole free of uneven wall surfaces since the scattering of laser beam is prevented.

A micro-via hole is made as follows. In the double-side copper-clad laminate or the multi-layered board, the copper foil surface which is to be irradiated with a carbon dioxide gas laser is oxidized to form a metal oxide, or a coating or a sheet formed of a resin composition containing 3 to 97% by volume of a metal compound powder, a carbon powder or a metal powder having a melting point of at least 900° C. and a bond energy of at least 300 kJ/mol is provided on the above surface, and the portion where the micro-via hole is to be formed is directly irradiated with a carbon dioxide gas laser.

The metal compound having a melting point of at least 900° C. and a bond energy of at least 300 kJ/mol, used as an auxiliary material in the present invention, can be generally selected from known metal compounds. For example, oxides are used. The oxides include titanias such as titanium oxide, magnesias such as magnesium oxide, oxides of iron such as iron oxide, oxides of nickel such as nickel oxide, manganese dioxide, oxides of zinc such as zinc oxide, silicon dioxide, aluminum oxide, rare earth metal oxides, oxides of cobalt such as cobalt oxide, oxides of tin such as tin oxide and oxides of tungsten such as tungsten oxide. Non-oxides may be used. The non-oxides include generally known oxides such as silicon carbide, tungsten carbide, boron nitride, silicon nitride, aluminum nitride, barium sulfate and rare earth metal sulfides. Carbon may be also used. Further, various glasses which are mixtures of metal oxide powders may be also used. Further, a carbon powder may be used. Further, powders of simple substances of silver, aluminum, bismuth, cobalt, copper, iron, magnesium, manganese, molybdenum, nickel, palladium, antimony, silicon, tin, titanium, vanadium, tungsten and zinc or metals powders of alloys of these may be used. These are used alone or in combination. These has an average particle diameter of 5 $\mu$m or less, preferably 1 $\mu$m or less.

Molecules are dissociated or melted to be dissipated during the irradiation with a carbon dioxide gas laser. Preferred are therefore those which has no adverse effect on a semiconductor chip or adhesion properties of a hole wall when the adhere to the hole wall, and the like. A composition containing Na, K or Cl ion is not preferred since it has an adverse effect on the reliability of a semiconductor. The amount of the above powder is 3 to 97% by volume, preferably 5 to 95% by volume. Preferably, the above powder is incorporated into an aqueous solution and homogeneously dispersed.

The organic substance as an auxiliary material is not specially limited, while it is selected from those which are not peeled off from a copper foil surface when kneaded, applied to the copper foil surface and dried. Preferably, a resin is used. In view of environmental protection, particularly, it is selected from water-soluble or dispersible resins such as polyvinyl alcohol, a polyvinyl alcohol saponification product and starch.

The method of preparing composition containing a metal compound powder, a carbon powder or a metal powder and an organic material is rot critical. The above method includes a method of kneading materials at a high temperature with a kneader and extruding the kneaded mixture in the form of a sheet, a method of providing a solvent or a resin composition soluble in water, adding the above powders thereto, homogeneously mixing them with stirring, applying the mixture as a coating composition to a copper foil surface and drying it to form a coating, a method of applying the resin composition to a thermoplastic film to form a sheet, and a method of impregnating a glass substrate or the like with the resin composition and drying it to obtain a sheet (to be also referred to as "auxiliary sheet for making a hole with a laser). The thickness of the coating or the sheet is not specially limited, while its total thickness is 30 to 200 $\mu$m.

The auxiliary sheet for making a hole with a laser can be used as it is. However, preferably, it is placed on a multi-layered board and kept in contact with it as intimately as possible, for making a micro-via hole having a better form. Generally, a sheet is fixed and kept in intimate contact to a multi-layered board by a method of attaching it with a tape, or the like. For attaching it more completely, the obtained sheet is placed on a double-side copper-clad laminate or a multi-layered board with its resin surface attached thereto, and the resin is melted, and the sheet is bonded, under heat and pressure. Otherwise, the resin surface layer is pre-wetted with water to a depth of 3 $\mu$m or less, and the bonding is performed at room temperature under pressure, whereby the adhesion to a copper foil surface is improved and a micro-via hole having an excellent hole form can be obtained.

The resin composition may be a resin composition which is not soluble in water but soluble in an organic solvent. However, a resin adheres to vicinities of a micro-via hole in some cases during the irradiation with a carbon dioxide gas laser, and not water but an organic solvent is required for removing the above resin, which makes the processing complicated and causes problems of pollution, and the like in a post step. It is therefore undesirable to use a resin composition soluble in an organic solvent.

Further, in another embodiment, a micro-via hole can be made after the surface of a copper foil is oxidized, while it is preferred to use the above auxiliary sheet in view of the form of a micro-via hole.

When the above auxiliary sheet is laminated on the copper foil surface under heat and pressure, the applied resin layer side thereof is attached to the copper foil surface, and the auxiliary sheet is intimately contacted to the copper foil surface with a roll by melting the resin layer at a temperature generally between 40° C. and 150° C., preferably between 60° C. and 120° C. at a linear pressure of 0.5 to 30 kg, preferably 1 to 20 kg. The temperature to be employed differs depending upon the melting point of a selected water-soluble resin and also differs depending upon a selected linear pressure and a feed rate. Generally, the lamination is carried out at a temperature higher than the melting point of the water-soluble resin by 5 to 20° C.

When the auxiliary sheet is intimately contacted to the copper foil surface at room temperature, the applied resin layer surface is wetted 3 $\mu$m or less deep with water to dissolve the water-soluble resin to some extent, and the auxiliary sheet is laminated under the above pressure. The method of wetting with water is not specially limited, while there may be employed, for example, a method of continuously applying water to a copper-clad laminate surface with a roll and then continuously laminating the auxiliary sheet onto the copper-clad laminate, or a method of continuously spraying water to a applied resin layer surface and then continuously laminating the auxiliary sheet onto the copper-clad laminate.

A micro-via hole is made as follows. A resin composition containing 3 to 97% by volume, preferably 5 to 95% by volume, of a metal compound powder having a melting point of at least 900° C. and a bond energy of 300 kJ/mol is attached to a thermoplastic film to have a total thickness of 30 to 200 $\mu$m, the resultant auxiliary sheet is intimately contacted to a micro-via-hole-forming position of the copper foil surface knot treated at all) which is to be irradiated with a carbon dioxide gas laser, by fixing the auxiliary sheet to the above position with a tape, by melting the resin under heat and pressure, or by wetting the water-soluble resin composition surface with water, attaching it at room temperature to dissolve the water-soluble resin surface, and a hole is made in the copper foil by directly irradiating the auxiliary sheet with a high-output carbon dioxide gas laser having a beam diameter focused to an intended diameter at an output of 20 to 60 mJ/pulse.

The carbon dioxide gas laser generally uses a wavelength of 9.3 to 10.6 $\mu$m in an infrared wavelength region. Preferably, first, a first copper foil as a surface is processed at an output of 20 to 60 mJ/pulse to make a hole, the irradiation with the carbon dioxide gas laser is continued as it is until the hole reaches a copper foil portion in the bottom of a micro-via hole, the output is decreased to an energy of 25 to 35 mJ/pulse, and a resin layer and part of the copper foil are processed with a last shot to form a bottom of the micro-via hole such that the copper foil is not penetrated through. Naturally, after the processing of the first copper foil layer, a resin layer may be processed with an energy of 5 to 35 mJ/pulse and the copper foil to form the bottom of a micro-via hole may be processed. Generally, when the insulation layer of a copper-clad laminate formed of a glass cloth is processed, 1 to 10 shots are applied per a thickness of 100 μm. After the irradiation, copper foil on each surface is two-dimensionally dissolved with a liquid chemical, and a bur formed in a micro-via hole portion is also removed with the liquid chemical. Then, a remaining resin exposed in the bottom portion and wall surface of the micro-via hole is completely removed by a gaseous phase method. The gaseous phase method can be generally selected from known methods. In plasma treatment in which a copper foil is dissolved, copper foils having a larger thickness are provided in advance, and each copper foil has a thickness of 3 to 7 μm after the treatment is completed.

The gaseous phase treatment can be selected from known methods such as plasma treatment and treatment with low-pressure ultraviolet light. The plasma treatment uses low-temperature plasma prepared by partially exciting and oniz- ing molecules with a high-frequency power source. In the plasma treatment, a high-rate treatment using ionic impact or a moderate treatment with radical species is generally used. As a processing gas, a reactive gas or an inert gas is used. As an inert gas, argon gas is mainly used. Physical surface treatment is carried out with argon gas, or the like. The physical treatment physically cleans a surface with an ionic impact. The low-pressure ultraviolet light is ultraviolet light in a short wavelength region. For example, the resin layer is decomposed and removed by irradiation with ultraviolet light in a short wavelength region having a peak at 184.9 nm or 253.7 nm. Then, the resin surface comes to be hydrophobic. Preferably, wetting treatment is therefore carried out in combination with the use of ultrasonic treatment when a hole has a small diameter, followed by copper plating. The wetting treatment is not specially limited. For example, an aqueous solution of potassium permanaganate is used, or soft etching is employed.

The carbon dioxide gas laser generally uses a wavelength of 9.3 to 10.6 μm in an infrared wavelength region. Preferably, first, a first copper foil as a surface is processed at an output of 20 to 60 mJ/pulse to make a hole, the output is decreased to an energy of 20 to 35 mJ/pulse, and a resin layer surface positioned below is processed with a last shot to form a bottom of the micro-via hole. When a resin layer on the copper foil positioned below is not removed with a last shot of 5 to 35 mJ/pulse so that the bottom of a micro-via hole is not formed, preferably, gas phase treatment and wetting treatment are carried out to remove the resin layer, followed by copper plating. Generally, when the insulation layer of a copper-clad laminate formed of a glass cloth is processed, 1 to 10 shots are applied per a thickness of 100 μm.

The micro-via hole is plated by generally known copper plating. Otherwise, an electrically conductive coating composition is filled in the micro-via hole to electrical conduction between a copper foil on the surface layer and a copper foil positioned below. The electrically conductive coating composition can be generally selected from known electrically conductive coating compositions. Specific examples thereof include copper paste, silver paste, solder paste and other solders.

Effect of the Invention

The printed wiring board of the present invention and a micro-via hole formed by the method of the present invention require no desmear treatment and have high reliability with regard to connection between an outermost layer and a copper foil positioned below it. Further, the processing rate is remarkably high as compared with processing with a drill, which improves productivity to a great extent. According to the present invention, further, copper foils are etched in a thickness direction to some extent, whereby a burr occurring in a micro-via hole portion can be concurrently removed. In forming a circuit on the copper foil obtained by metal plating on each surface, therefore, defects such as a short circuit and a pattern breakage do not take place, and a high-density printed wiring board can be produced. There can be also provided a method of making a micro-via hole which makes it possible to provide the above printed wiring board.

EXAMPLES

The present invention will be explained more specifically with reference to Examples hereinafter, in which "part" stands for "part by weight" unless otherwise specified.

Example 1

900 Parts of 2,2-bis(4-cyanatophenyl)propane and 100 parts of bis(4-maleimidephenyl)methane were melted at 150° C. and allowed to react with stirring for 4 hours, to obtain a prepolymer. The prepolymer was dissolved in mixed solvents of methyl ethyl ketone and dimethylformamide. To the resultant solution were added 400 parts of a bisphenol A type epoxy resin (trade name: Epikote 1001, supplied by Yuka Shell Epoxy K.K.) and a cresol novolak type epoxy resin (trade name: ESCN-220F, supplied by Sumitomo Chemical Co., Ltd.), and these materials were homogeneously dissolved and mixed. Further, as a catalyst, 0.4 part of zinc octylate was added, and these materials were dissolved and mixed. To the resultant mixture were added 500 parts of an inorganic insulating filler (trade name: baked talc, average particle diameter 0.4 μm, supplied by Nippon Talc K.K.) and 8 parts of a black pigment, and these materials were homogeneously stirred and mixed to prepare a varnish A. A 100 μm thick glass woven fabric was impregnated with the above varnish, and the impregnated glass woven fabric was dried at 150° C. to prepare a prepreg (prepreg B) having a gelation time of 120 seconds at 170° C. and having a glass fabric content of 57% by weight. A 18 μm thick electrolytic copper foil was placed on each surface of one sheet of the above prepreg B, and the resultant set was laminate-formed at 200° C. at 20 kgf/cm$^2$ under a vacuum of 30 mmHg or less for 2 hours, to give a double-side copper-clad laminate B having an insulation layer thickness of 100 μm.

Separately, 800 parts of a copper oxide powder having an average particle diameter of 0.86 μm was added to a varnish prepared by dissolving a partially saponified polyvinyl alcohol powder in water, and the mixture was homogeneously stirred and mixed (varnish C). The varnish C was applied to a 50 μm thick polyethylene terephthalate film to form a 20 μm thick coating, and the coating was dried at 110° C. for 30 minutes to give a sheet with a film having a copper oxide powder content of 20% by volume. The sheet was placed on the double-side copper-clad laminate B, and the sheet surface was 1 pulse (shot) irradiated directly with a carbon dioxide gas laser at an output of 40 mJ/pulse. Then, the output was decreased to 30 mJ/pulse, and the micro-via-hole-forming portion of the copper foil positioned below was processed and removed with 2 pulses to make 900 holes having a diameter of 100 μm at intervals of 400 μm. The micro-via holes were made in 70 blocks (63,000 micro-via holes) as a total. Then, the reverse surface was covered with an etching resist, and the front surface was entirely treated by the SUEP method to remove burrs in micro-via hole portions by dissolving them, and at the same time, the copper foil on the front surface was also dissolved until it had a thickness of 7 μm. After the etching resist was removed, the front surface was entirely covered with an etching resist, and the copper foil on the reverse surface was dissolved and removed by the SUEP method until it had a thickness of 7 μm. After the etching resist was removed, the board was placed with copper to form a 15 μm thick copper plating (total thickness: 22 μm). A land having a diameter of 250 μm was formed in each micro-via hole portion, copper foil in the bottom of each micro-via hole was used as a ball pad, and the 900 micro-via holes were connected as described in 5) "Heat cycle test of micro-via holes" to be described later, to carry out a heat cycle test. Further, a circuit (200 pieces of line/space=50/50 μm) was formed, land for solder ball, etc., were formed thereon, portions excluding at least a semiconductor chip, bonding pad and solder ball pad were covered with a plating resist, and plating with nickel and gold was effected, to prepare a printed wiring board. Table 1 shows results of evaluation of this printed wiring board.

Example 2

1,400 Parts of an epoxy resin (trade name: Epikote 5045), 600 parts of an epoxy resin (trade name: ESCN220F), 70 parts of dicyandiamide and 2 parts of 2-ethyl-4-methylimidazole were dissolved in mixed solvents of methyl ethyl ketone and dimethyformamide. Further, 500 parts of the same insulating inorganic filler as that in Example 1 was added, and the mixture was forcibly stirred to form a homogeneous dispersion, whereby a varnish D was obtained. A 50 μm thick glass woven fabric was impregnated with the varnish D and the impregnated glass woven fabric was dried to give a prepreg (prepreg E) having a gelation time of 150 seconds and having a glass cloth content of 35% by weight. One sheet of the prepreg E was used, and a 18 μm thick electrolytic copper foil was placed on each surface, and the resultant set was laminate-formed at 190° C. at 20 kgf/cm$^2$ under a vacuum of 30 mmHg or less for 2 hours, to prepare a double-side copper-clad laminate F. The insulating layer had a thickness of 100 μm. A circuit was formed on each surface and then subjected to oxidation of copper, a sheet of the prepreg E was placed on each surface, a 12 μm thick electrolytic copper foil was placed on each surface, and the resultant set was similarly laminate-formed to obtain a double-side copper-clad four-layered board F.

Separately, a copper powder having an average particle diameter of 0.7 μm was dissolved in a polyvinyl alcohol solution to prepare a varnish G having a copper powder content of 70% by volume. The varnish G was applied to the above double-side copper-clad four-layered board F to have a thickness of 40 μm and the applied varnish F was dried at 110° C. for 30 minutes to form a coating (FIG. 1(1)). The coating was 2 pulses (shots) irradiated with a carbon dioxide gas laser at an output of 40 mJ/pulse to make holes having a diameter of 100 μm each, and similar processing was carried out 2 pulses at 28 mJ/pulse, followed by corresponding procedures in Example 1, to prepare a multi-layered printed wiring board in which micro-via holes having a diameter of 100 μm each were made (FIGS. 1 and 2(2), (3), (4) and (5)). Table 1 shows evaluation results.

Comparative Example 1

The same double-sicie copper-clad laminate as that in Example 1 and the multi-layered board as that in Example 2 were used, and attempts were made to similarly make micro-via holes with a carbon dioxide gas laser without any surface treatment or without using an auxiliary sheet on the surface. No holes were made.

Comparative Example 2

Figure 3:
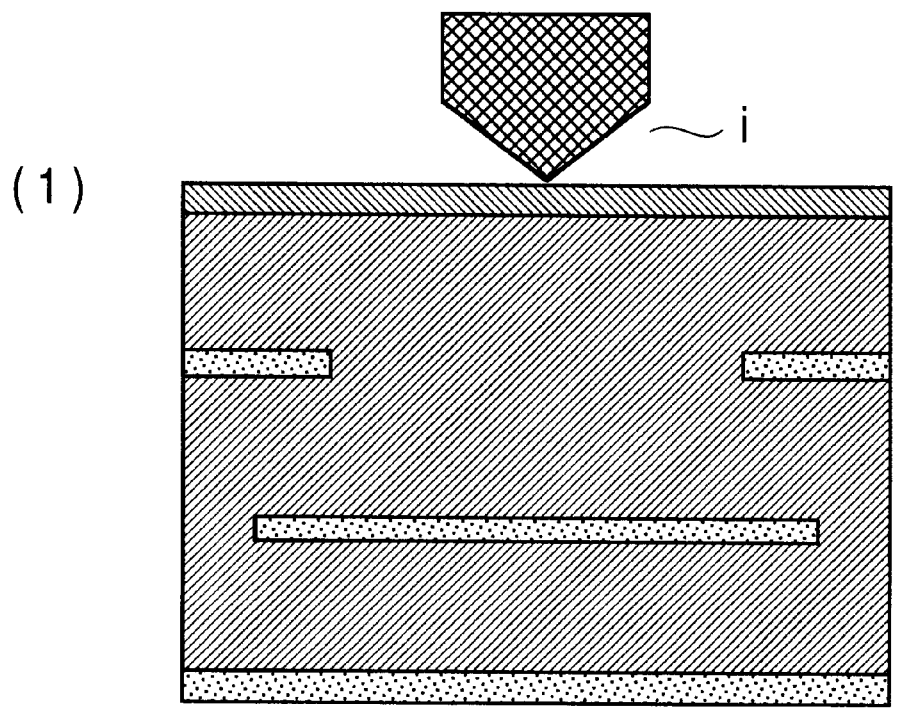
FIG. 3 shows the steps of making a micro-via hole with a mechanical drill in Comparative Example 2.
Figure 3:
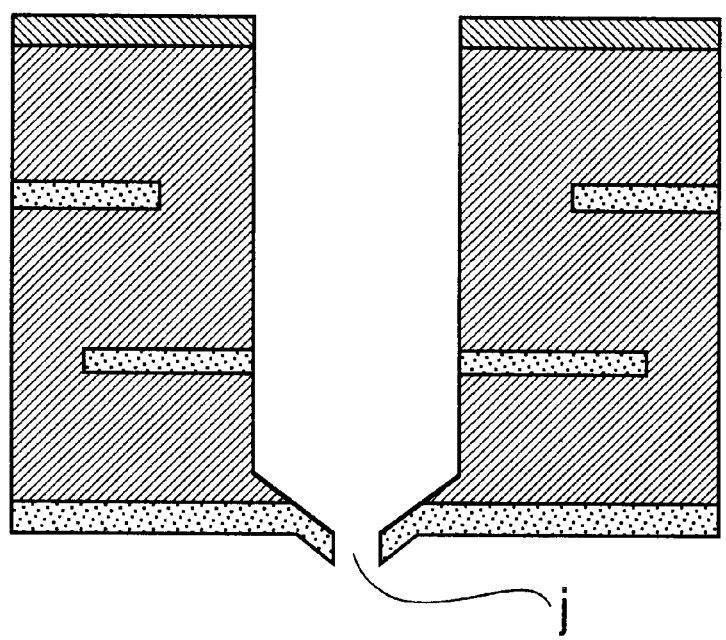

In Example 2 (FIG. 3(1)), 63,000 holes which reached from the front surface to the copper foil positioned below were similarly made with a mechanical drill having a drill diameter of 100 μm. Cross sections of all the holes were observed to show that 13% of the total holes had been made as shown in FIG. 3(2). The rest of the holes penetrated through the copper foil as an inner layer to reach the resin layer. The desmear treatment was carried out once without carrying out the SUEP treatment, and then a printed wiring board was similarly prepared. Table 1 shows evaluation results.

Comparative Example 3

Figure 2:
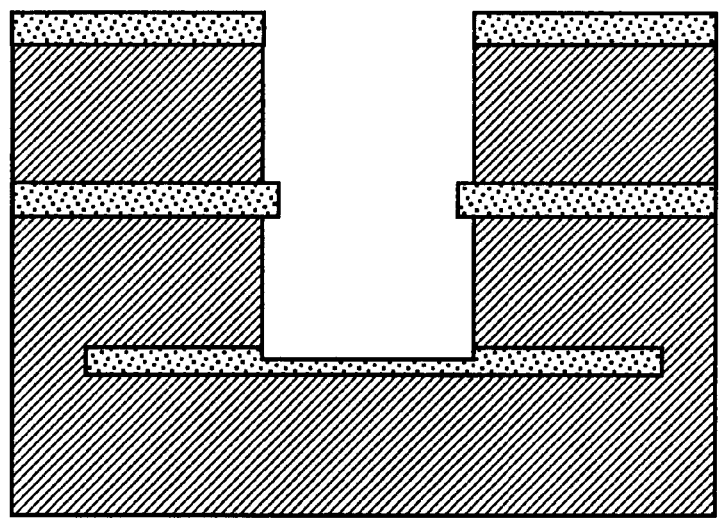
FIG. 2 shows the steps of making a micro-via hole with a carbon dioxide gas laser in Example 2 [removal of burrs by SUEP (4)] and [copper plating (5)].
Figure 2:
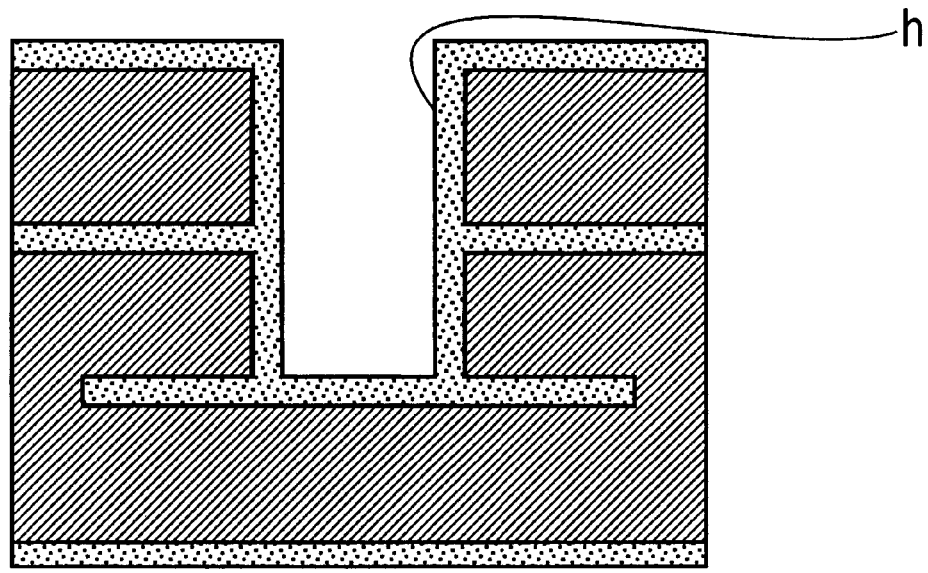

The same double-side copper-clad laminate (FIG. 1(1)) as that used in Example 2 was provided, and the surface thereof was etched and was three shots irradiated with a carbon dioxide gas laser at an output of 18 mJ/pulse to similarly make 63,000 holes having a diameter of 100 μm each at intervals of 400 μm. The known desmear treatment was carried out twice without the SUEP treatment, plating was similarly carried out to form a 15 μm thick copper plating, a circuit was formed on each surface, and the resultant laminate was similarly processed to prepare a printed wiring board. Table 1 shows evaluation results.

Comparative Example 4

Figure 4:
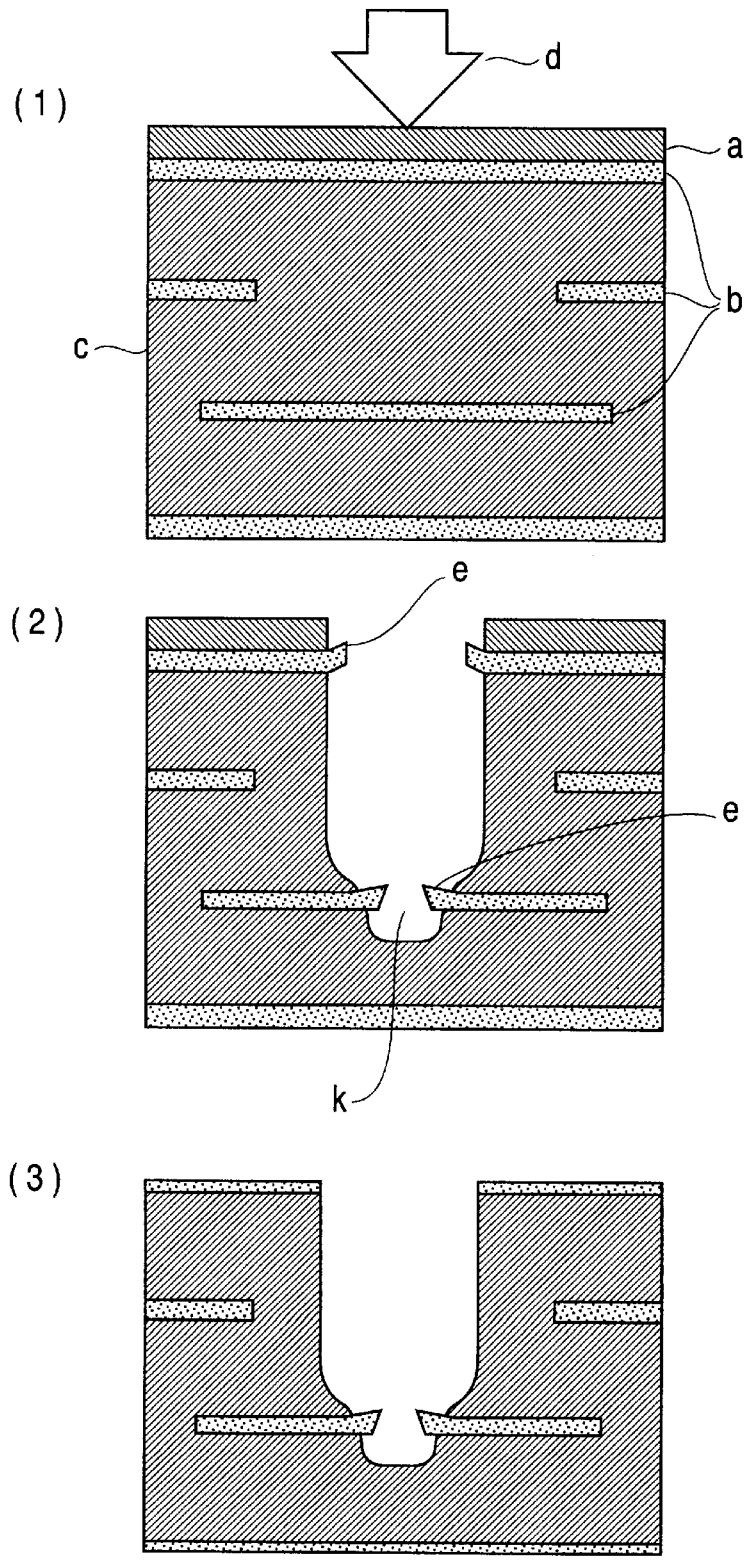
FIG. 4 shows the steps of making a micro-via hole with a carbon dioxide gas laser in Comparative Example 4.
Figure 5:
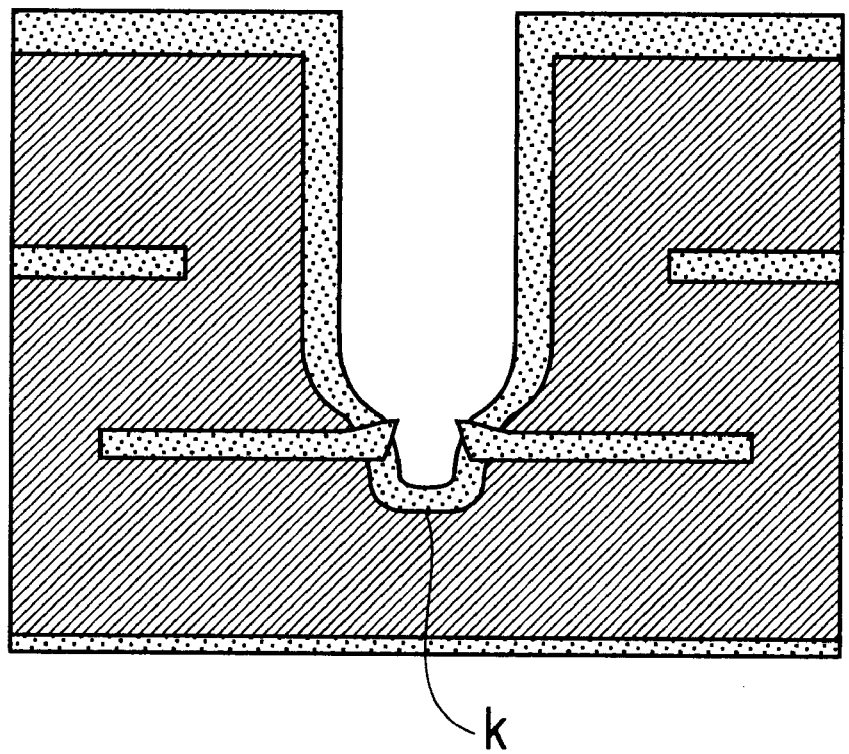
FIG. 5 shows the step of copper plating in Comparative Example 4.

In the same double-side copper-clad laminate as that in Example 2, micro-via holes were similarly made by 4 pulses irradiating it with a carbon dioxide gas laser at an output of 40 mJ/pulse. Each micro-via hole penetrated through the copper foil as an inner layer to reach the resin layer (FIGS. 4 and 5). The laminate was subjected to the SUEP treatment, and a printed wiring board was prepared. Table 1 shows evaluation results.

TABLE 1

| | Example | | Comparative Example | | |
|---|---|---|---|---|---|
| | 1 | 2 | 2 | 3 | 4 |
| Form of micro-via hole bottom | Nearly flat | Nearly flat | Hole penetrating through copper foil as inner layer | Smooth | Hole penetrating through copper foil as inner layer |
| Necessity of desmear treatment | No | No | Yes | Yes | No |
| Pattern breakage and short circuit | 0/200 | 0/200 | 54/100 | 55/200 | 0/200 |
| Glass transition temperature (° C.) | 235 | 160 | 160 | 160 | 160 |
| Micro-via hole heat-cycle test (%) | | | | | |
| 100 cycles | 2.0 | 2.4 | — | 3.0 | 2.9 |
| 300 cycles | 2.5 | 2.7 | — | 8.7 | 5.5 |
| 500 cycles | 2.4 | 2.7 | — | 23.7 | 11.3 |

TABLE 1-continued

| | Example | | Comparative Example | | |
|---|---|---|---|---|---|
| | 1 | 2 | 2 | 3 | 4 |
| Time for making micro-via holes (minute) | 10 | 12 | 630 | — | — |

<Measurement methods>

1) Form of micro-via hole bottom

A cross section of the bottom was visually observed.

2) Time for making micro-via holes

A time period required for making 63,000 micro-via holes/board with a carbon dioxide gas laser or a mechanical drill.

3) Pattern breakage and short circuit

In Examples and Comparative Examples, 200 patterns having a line/space=50 μm/50 μm were visually observed through a magnifier, and patterns having pattern breakage and short circuits were counted. A numerator shows the number of patterns having a pattern breakage and short circuit.

4) Glass transition temperature Measured by a Dynamic Mechanical Analysis (DMA) method.

5) Heat-cycle test of micro-via holes

900 Micro-via holes of a board were electrically connected as follows. Adjacent two micro-via holes were connected through lands, so as to prepare 450 combinations of connected adjacent two micro-via holes. And, for example, one micro-via hole of one combination was connected to one micro-via hole of one adjacent combination through copper foil in the micro-via hole bottom, the other micro-via hole of the "one combination" was connected to the other micro-via hole of the other adjacent combination through copper foil in the micro-via hole bottom, and in this manner, the 900 micro-via holes were connected through lands or through copper foil in micro-via hole bottom. Then, the board was immersed in a solder having a temperature of 260° C. for 30 seconds, taken out and allowed to stand at room temperature for 5 minutes. The above immersion for 30 seconds and the above standing for 5 minutes were set as 1 cycle, and the above procedures were repeated 200 cycles as a total. Thereafter, the board was measured for a resistance value to determine a maximum value of a change in resistance.

Example 3

A sheet with a film having a copper oxide powder content of 20% by volume and having a melting point of 83° C. was prepared in the same manner as in Example 1 except that the 50 μm thick polyethylene terephthalate film used in Example 1 was replaced with a 25 μm thick polyethylene terephthalate film.

The above sheet was laminated on the same double-side copper-clad laminate B as that obtained in Example 1 at 90° C., and the sheet was 2 shots irradiated with a carbon dioxide gas laser at an output of 40 mJ/pulse, to make 900 holes having a diameter of 100 μm each at intervals of 400 μm. Then, an copper foil as an inner layer was 1 shot irradiated with the carbon dioxide gas laser at a decreased output of 7 mJ/pulse to remove surface portions of the copper foil in portions which were to form micro-via hole bottoms. In this manner, micro-via holes were made in 70 blocks (63,000 micro-via holes as a total). Then, the front and reverse surfaces of the board were entirely treated by the SUEP method to remove burrs in micro-via hole portions and at the same to dissolve the surface copper foil until it had a thickness of 7 μm. The board was placed in a plasma treatment machine and treated with flowing oxygen for 10 minutes to decrease the thickness of the surface copper foil to 5 μm and to remove a resin layer adhering a copper foil surface in the bottom of each micro-via hole. Then, desmear treatment was carried out once, and then, the board was plated with copper to form a 15 μm thick copper plating. A land having a diameter of 250 μm was formed in each micro-via hole portion, and copper foil in the bottom of each micro-via hole was used as a ball pad. A total of 900 micro-via holes were connected as described in 5) "Heat cycle test of micro-via holes" to carry out a heat cycle test. Further, circuits (line/space=50/50 μm, 200 patterns) were formed, and lands for solder balls were formed thereon. Portions other than at least a semiconductor chip, the bonding pads and the solder ball pads were covered with a plating resist, and plating with nickel and gold was carried out, to prepare a printed wiring board. Table 2 shows the results of evaluation of the printed wiring board.

Example 4

A 100 μm thick glass woven fabric was impregnated with the varnish D prepared in Example 2, and the impregnated glass woven fabric was dried to prepare a prepreg (prepreg H) having a gelation time of 150 seconds and having a glass cloth content of 55% by weight and a prepreg (prepreg I) having a gelation time of 180 seconds and having a glass cloth content of 44% by weight. One sheet of the prepreg H was used, a 18 μm thick electrolytic copper foil was placed on each surface of the sheet of the prepreg H, and the resultant set was laminate-formed at 190° C. at 20 kgf/cm$^2$ under a vacuum of 30 mmHg or less for 2 hours, to prepare a double-side copper-clad laminate J. The insulation layer had a thickness of 100 μm. Circuits were formed on both the surfaces, a 12 μm electrolytic copper foil was placed on each surface, and the resultant set was similarly laminate-formed to give a double-side copper-clad four-layered laminate.

Separately, a copper powder having an average particle diameter of 0.7 μm was dissolved in a polyvinyl alcohol solution, to prepare a varnish having a copper powder content of 70% by volume. The varnish was applied to the above double-side copper-clad four-layered laminate and dried at 110° C. for 30 minutes to form a 40 μm thick coating. The coating was 2 shots irradiated with a carbon dioxide gas laser at an output of 40 mJ/pulse, and then 1 shot was similarly applied at an output of 13 mJ/pulse to make micro-via holes having a diameter of 100 μm in the copper foil. Thereafter, the board was treated by low-pressure ultraviolet light treatment in place of the plasma treatment in Example 3, and processed in the same manner as in Example 3, to prepare a multi-layered printed wiring board having the micro-via holes. Table 2 shows the results of evaluation thereof.

Comparative Examples 5 and 6

The same double-side copper-clad laminate as that in Example 3 and the same double-side copper-clad four-layered laminate as that in Example 4 were provided, and treated in the same manner as in Example 3 or 4 without carrying out the surface SUEP treatment and the plasma or low-pressure ultraviolet light treatment of the bottom of the micro-via holes, to prepare printed wiring boards. Table 2 shows the results of evaluation thereof.

TABLE 2

|  | Example | | Comparative Example | |
|---|---|---|---|---|
|  | 3 | 4 | 5 | 6 |
| Form of micro-via hole bottom | Nearly flat | Nearly flat | Nearly flat | Nearly flat |
| Pattern breakage and short circuit (pieces) | 0/200 | 0/200 | 57/200 | 57/200 |
| Glass transition temperature (° C.) | 235 | 160 | 235 | 160 |
| Heat cycle test of micro-via hole (%) | | | | |
| 100 cycles | 2.0 | 2.4 | >50 | >50 |
| 300 cycles | 2.5 | 2.7 | — | — |
| 500 cycles | 2.4 | 2.7 | — | — |
| 1,000 cycles | 2.6 | 2.9 | — | — |
| Time period for making micro-via holes (minute) | 10 | 10 | 10 | 10 |

Example 5

A 100 μm thick glass woven fabric was impregnated with the same varnish A as that obtained in Example 1, and the impregnated fabric was dried at 150° C. to prepare a prepreg (prepreg K) having a gelation time of 120 seconds at 170° C. and having a glass cloth content of 53% by weight.

Figure 6:
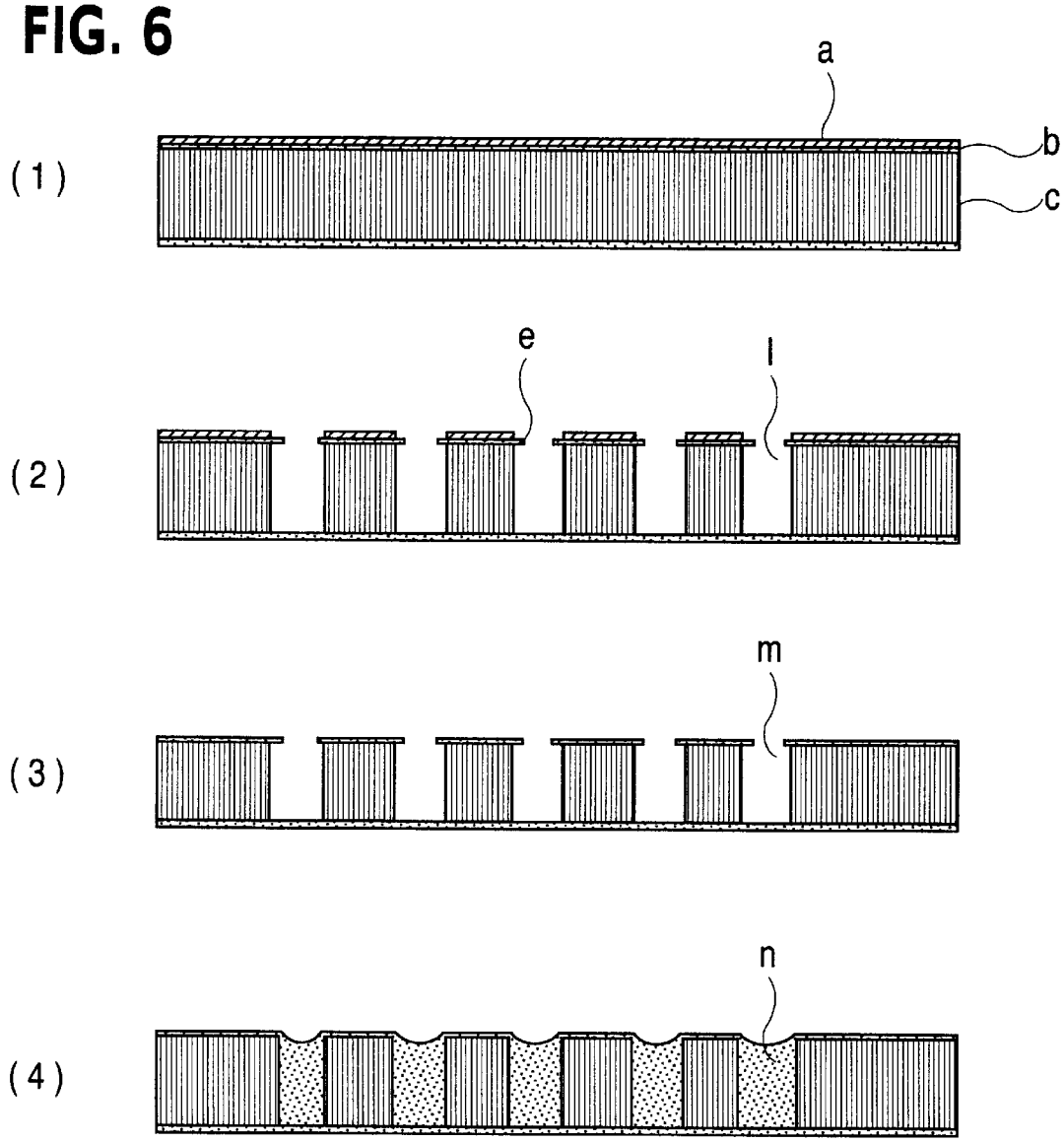
FIG. 6 shows the steps of making a micro-via hole in a double-side copper clad laminated board with a carbon dioxide gas laser and copper plating in Example 5.

A 7 μm thick electrolytic copper foil (FIG. 6b) was placed on each surface of one sheet of the above prepreg K, and the resultant set was laminate-formed at 200° C. at 20 kgf/cm² under vacuum of 30 mmHg or less for 2 hours, to give a double-side copper-clad laminate L having an insulating layer thickness of 100 μm.

Separately, 800 parts of a copper oxide powder (average particle diameter: 0.86 μm) as a metal powder was added to a varnish prepared by dissolving a polyvinyl alcohol powder in water, and the mixture was homogeneously stirred and mixed. The mixture was applied to one surface of a 25 μm thick polyethylene terephthalate film to form a 60 μm thick coating and the coating was dried at 110° C. for 30 minutes, to prepare an auxiliary sheet M having a copper powder content of 65% by volume. The auxiliary sheet M (FIG. 6a) was placed on the above double-side copper-clad laminate L such that the resin surface faced the copper foil side (FIG. 6(1)), and the auxiliary sheet M was fixed with a Cellophane tape. Then, the auxiliary sheet was 1 shot irradiated with a carbon dioxide gas laser at an output of 40 mJ/pulse to make 900 holes in the copper foil, then 1 shot was applied at a decreased output of 30 mJ/pulse, and further, the bottoms of blind micro-via holes, i.e., the copper foil positioned below, were 1 shot irradiated at an output of 7 mJ/pulse, to make 900 blind micro-via holes (FIG. 6, 1) having a diameter of 100 μm each in a 50 mm×50 mm square area of each of 70 blocks (FIG. 6(2)). No SUEP treatment was carried out, and the above board was placed in a plasma treatment unit, and treated in an oxygen atmosphere for 10 minutes and in an argon atmosphere for 5 minutes to remove remaining resin layer inside each blind micro-via hole and to remove surface layers of the front and reverse copper foils. As a result, each copper foil had a thickness of 5 μm. The resultant board was placed in a potassium permanganate aqueous solution, ultrasonically wet-treated (FIG. 6(3)) and electroless-plated with copper. Further, the board was plated with copper by a pulse electro-plating (Nippon Rylonal Co., Ltd.) method to fill copper plating in at least 90% by volume of each blind micro-via hole (FIG. 6(4)). The surface was soft-etched, and a circuit (200 pieces, line/space=100/100 μm), lands for solder balls, and the like were formed on each surface according to known methods. Portions other than a semiconductor chip portion, the bonding pad portions and the solder ball pad portions were covered with a plating resist, followed by plating with nickel and gold, to give a printed wiring board. Table 3 shows the results of evaluation of the printed wiring board.

Example 6

A metal compound powder ($SiO_2$: 57 wt %, MgO: 43 wt %, average particle diameter: 0.4 μm) was added to a resin solution prepared by dissolving a water-soluble polyester resin having a melting point of 58° C. in water, and these materials were homogeneously stirred and mixed. Then, the mixture was applied to a 50 μm thick polyethylene terephthalate film to form a 15 μm thick coating, and the coating was dried at 110° C. for 25 minutes, to prepare a film-shaped auxiliary material N having a metal compound content of 90% by volume.

Separately, 700 Parts of an epoxy resin (trade name: Epikote 5045), 300 parts of an epoxy resin (trade name: ESCN220F), 35 parts of dicyandiamide and 1 part of 2-ethyl-4-methylimidazole were dissolved in mixed solvents of methyl ethyl ketone and dimethylformamide. Further, 800 parts of calcined talc (trade name: Baked talc) and 8 parts of a black pigment were added, and the mixture was forcibly stirred to form a homogeneous dispersion, whereby a varnish was obtained. A 100 μm thick glass woven fabric was impregnated with the above varnish and the impregnated glass woven fabric was dried to give a prepreg (prepreg O) having a gelation time of 150 seconds and having a glass cloth content of 55% by weight. Further, a prepreg P having a glass content of 43% by weight was also prepared.

One sheet of the prepreg O was used, and a 18 μm thick electrolytic copper foil was placed on each surface, and the resultant set was laminate-formed at 190° C. at 20 kgf/cm² under a vacuum of 30 mmHg or less for 2 hours, to prepare a double-side copper-clad laminate Q. The insulating layer had a thickness of 100 μm.

A circuit was formed on each surface and then subjected to oxidation of copper, a sheet of the prepreg Q was placed on each surface, a 12 μm thick electrolytic copper foil was placed on each surface, and the resultant set was similarly laminate-formed to obtain a multi-layered board.

The above auxiliary material E (FIG. 7a) was placed on the multi-layered board such that the resin composition surface thereof faced the multi-layered board, and the auxiliary material E was laminated with a roll at 100° C. at a linear pressure of 1.5 kgf, to form a coating having excellent contacting properties.

Figure 7:
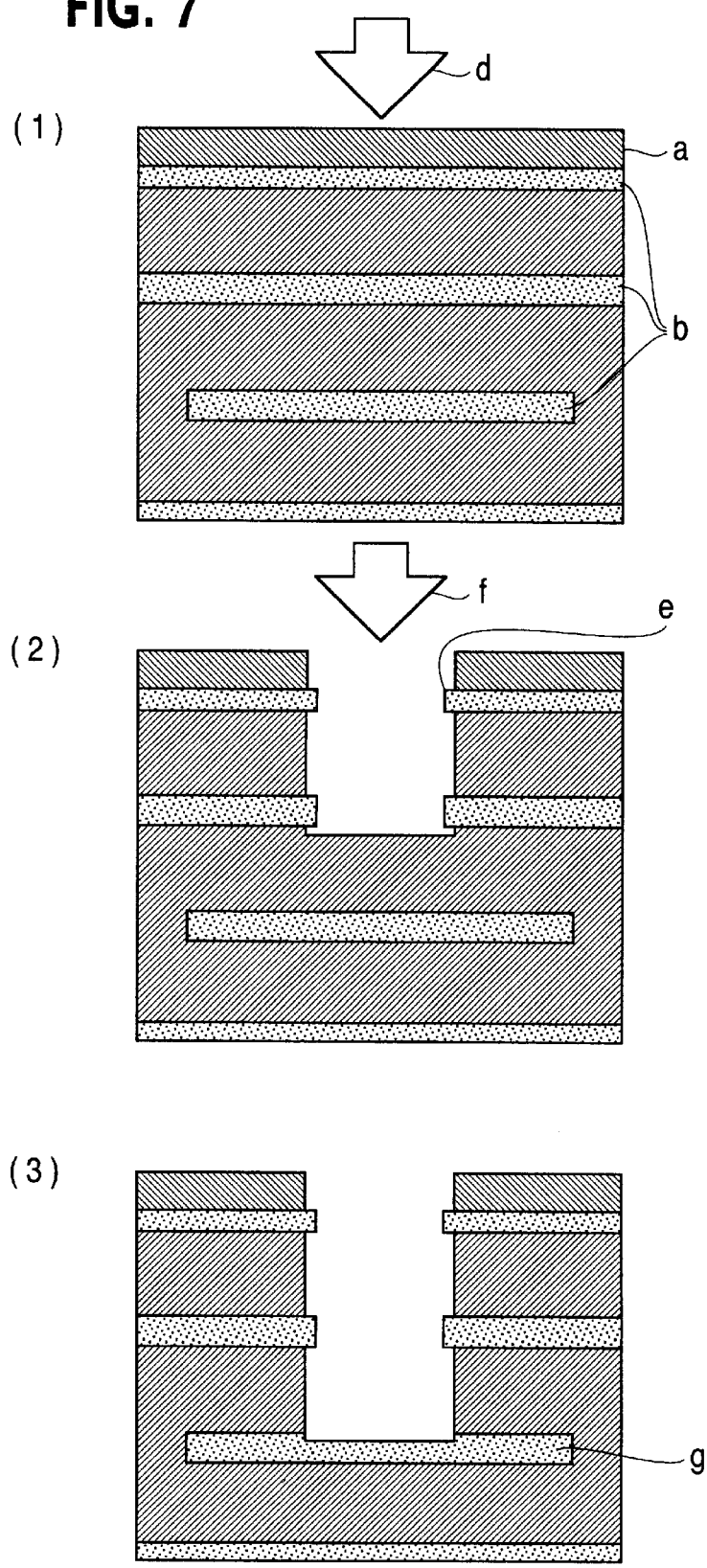
FIG. 7 shows the steps of making a micro-via hole in a multi-layered board with a carbon dioxide gas laser in Example 6.

The coating was 1 pulse irradiated with a carbon dioxide gas laser at an output of 35 mJ/pulse, followed by 1 pulse irradiation at an output of 20 mJ/pulse and 1 pulse irradiation at an output of 5 mJ/pulse, to make blind micro-via holes having a diameter of 100 μm each (FIGS. 7(1) and 7(2)).

Figure 8:
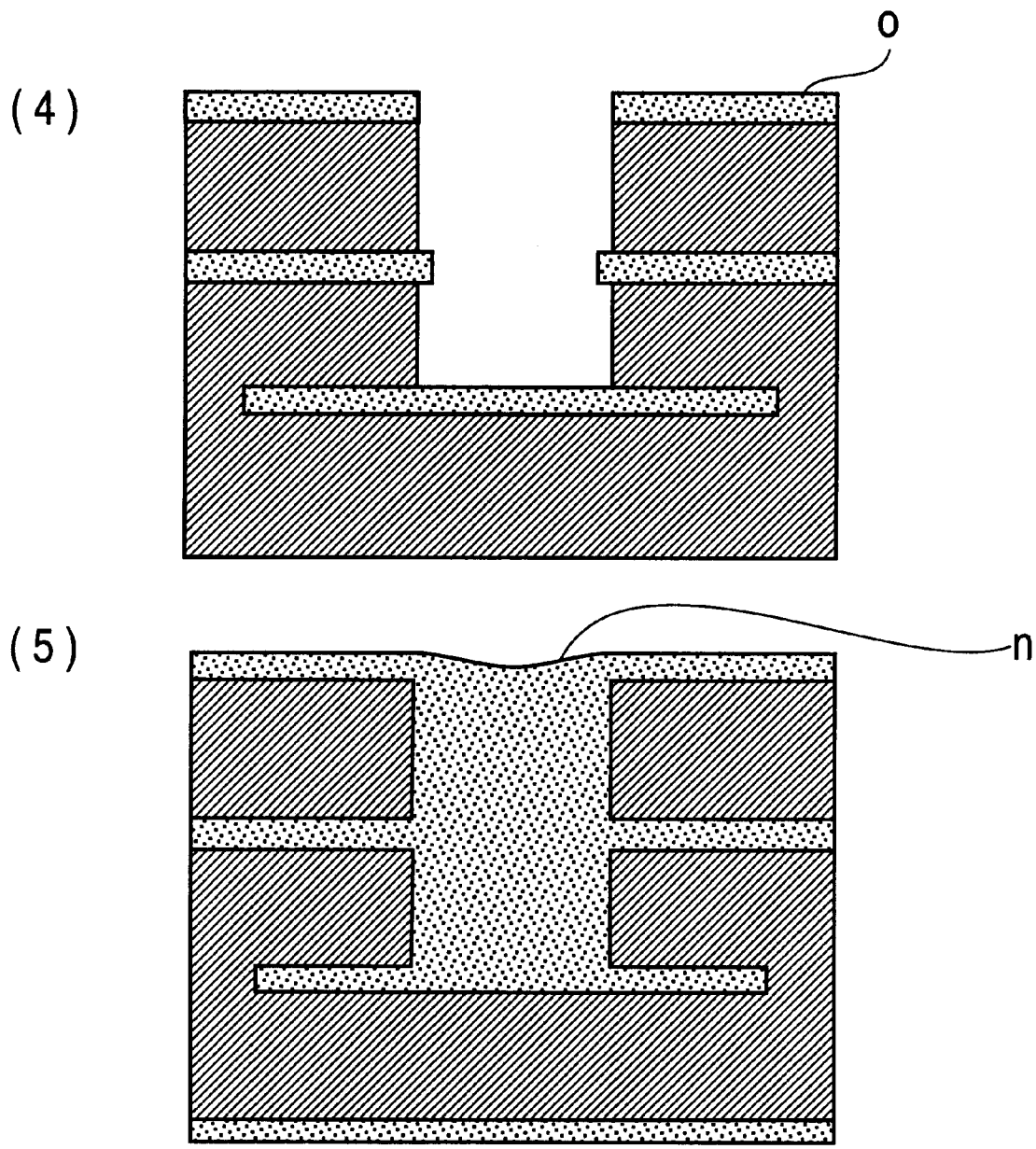
FIG. 8 shows the steps of The Surface Uniform Etching process (SUEP) treatment with a carbon dioxide gas laser and copper plating in Example 6.

The auxiliary sheet on the surface was peeled off, the surface was treated by the SUEP method until the coper foil had a thickness of 5 μm (FIG. 8(3)). Then, the board was placed in a plasma treatment unit, treated in an oxygen gas flow for 10 minutes and in an argon gas flow for 5 minutes, and ultrasonically wet-treated in a potassium permanganate aqueous solution. Then, pulse copper plating was similarly carried out, to fill copper plating in at least 95% of volume of each blind micro-via hole (FIG. 8(5)), and a printed wiring board was similarly prepared. Table 3 shows the result of evaluation thereof.

Comparative Example 7

Figure 9:
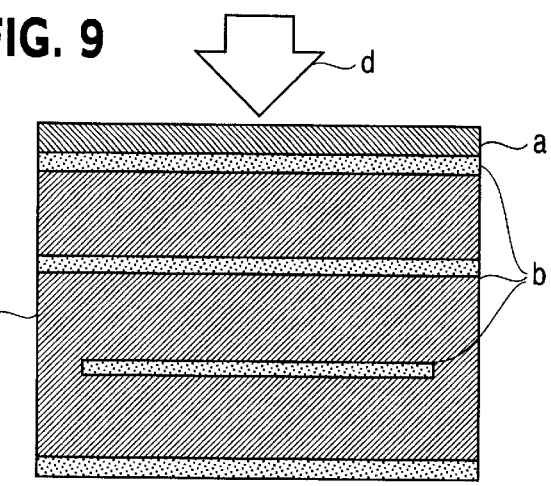
FIG. 9 shows the steps of making a micro-via hole with a carbon dioxide gas laser and copper plating in Comparative Example 7.
Figure 9:
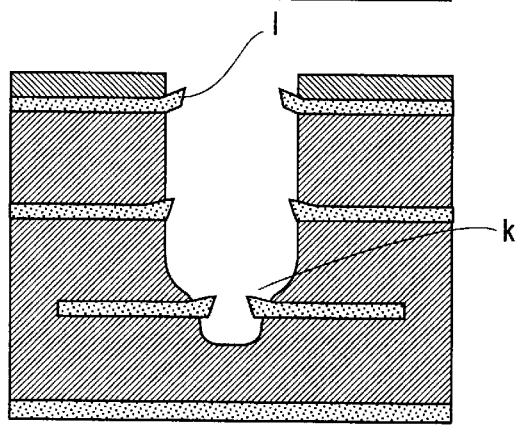
Figure 9:
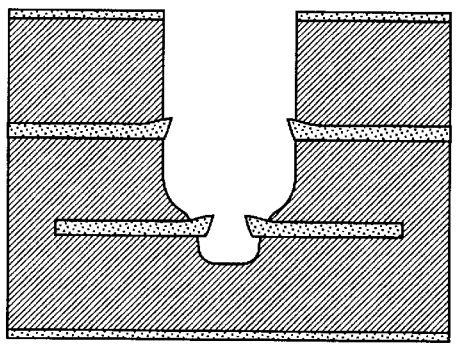
Figure 9:
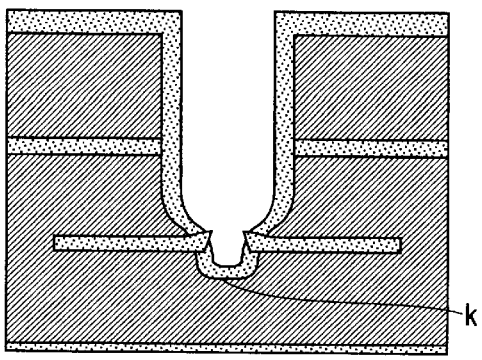

A multi-layered board was prepared in the same manner as in Example 6 except that 1,000 parts of Epikote 5045 alone was used as an epoxy resin. An attempt was made to make blind micro-via holes by 1 shot irradiation with a carbon dioxide gas laser at an output of 45 mJ/pulse and 3 shots similar irradiation with the carbon dioxide gas laser. In this case, holes penetrated through the copper foil as an inner layer (FIG. 9(2)). Desmear treament was carried out twice without carrying out the SUEP treatment (FIG. 9(3)), and copper plating was carried out according to a conventional method (FIG. 9(4)), to prepare a printed wiring board.

Comparative Example 8

Figure 10:
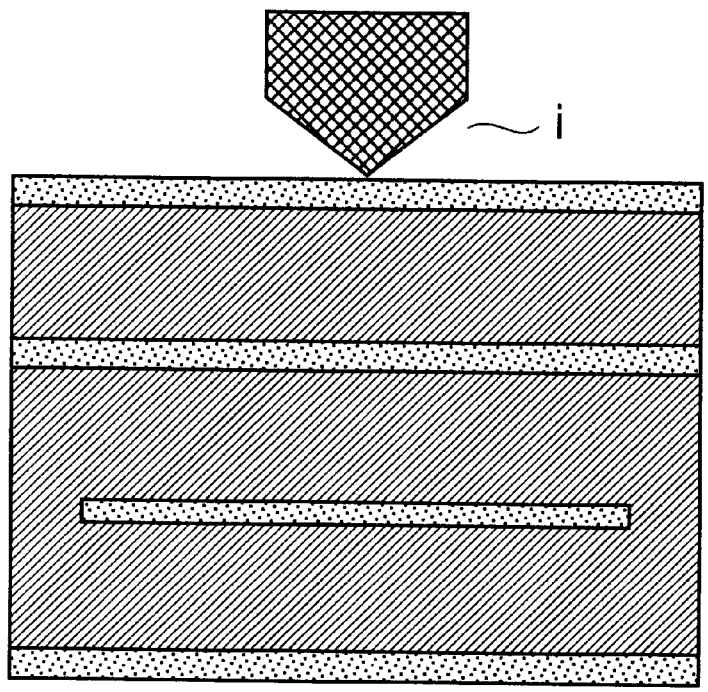
FIG. 10 shows the steps of making a micro-via hole with a mechanical drill in Comparative Example 7 in which the drill penetrates through a lowermost layer.
Figure 10:
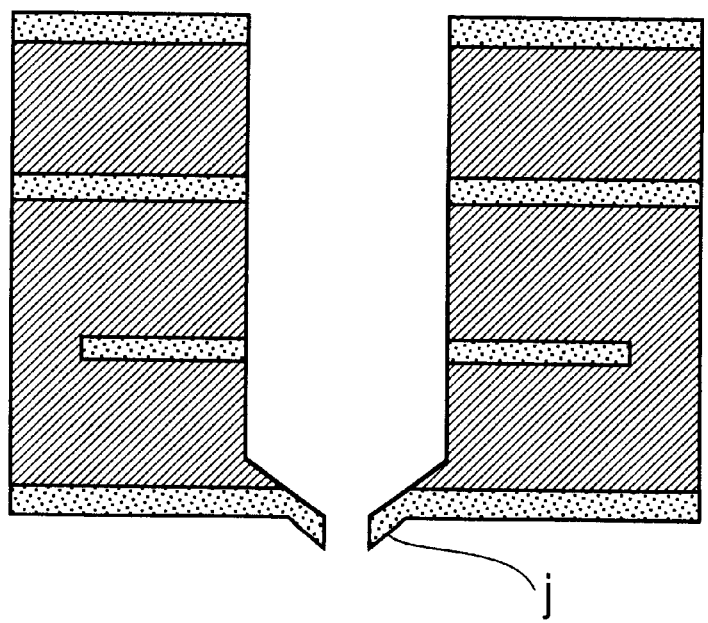

Attempt was made to make blind micro-via holes at intervals of 300 μm in the same multi-layered board as that in Example 6 with a mechanical drill having a drill diameter of 150 μm at a rotation of 100,000 rpm at a feed rate of 1 m/minute. Cross sections of all the micro-via holes were visually observed, and it was found that 13% of the micro-via holes were made as shown in FIG. 10(2). The rest micro-via holes penetrated through the copper foil as an inner layer and reached a resin layer. Desmear treament was carried out once without carrying out the SUEP treatment, and copper plating was carried out according to a conventional method, to prepare a printed wiring board. Table 3 shows the results of evaluation thereof.

TABLE 3

|  | Example | | Comparative Example | |
| --- | --- | --- | --- | --- |
|  | 5 | 6 | 7 | 8 |
| Pattern breakage and short circuit (pieces) | 0/200 | 0/200 | 14/200 | 15/200 |
| Glass transition temperature (° C.) | 235 | 160 | 139 | 160 |
| Heat cycle test of blind micro-via hole (%) | | | | |
| 100 cycles | 1.2 | 1.4 | 3.5 | 6.0 |
| 300 cycles | 1.3 | 1.5 | 7.3 | 7.3 |
| 500 cycles | 1.4 | 1.6 | 15.7 | 9.9 |
| Time period for making micro-via holes (minute) | 10 | 10 | — | 630 |

What is claimed is:

1. The method of making a micro-via hole for electrically connecting a first copper foil as an outermost layer of a printed wiring board to a copper foil in a bottom of the micro-via hole with a carbon dioxide gas laser, the method comprising providing a coating or sheet of an organic substance containing 3 to 97% by volume of at least one member selected from the group having a melting point of at least 900° C. and a bond energy of at least 300 kJ/mol, a carbon powder and a metal powder on a copper foil as an outermost layer of a copper-clad laminate having at least two copper layers, irradiating the coating or sheet with a carbon dioxide gas laser at an output of 20 to 60 mJ/pulse, thereby removing a micro-via-hole-forming portion of at least the copper foil as the outermost layer, then irradiating micro-via-hole-forming portions of a resin layer or a resin layer and a copper layer with a carbon dioxide gas laser at an output of 5 to 35 mJ/pulse to make a micro-via hole which does not penetrate through the copper foil in a bottom of the micro-via hole, and electrically connecting the copper foil as the outermost layer and the copper foil in the bottom of the micro-via hole with a metal plating or an electrically conductive coating composition, wherein the coating or sheet of the organic substance is a coating formed of a coating composition containing a mixture of at least one of a metal compound powder, a carbon powder or a metal powder with a water-soluble resin, or a sheet which is formed by applying the coating composition on one surface of a thermoplastic film and has a total thickness of 30 to 200 μm.

2. The method according to claim 1, wherein the first copper foil layer of the copper-clad laminate is oxidized, the coating or sheet of the organic substance is placed on the oxidized first copper foil surface as required, and the micro-via hole is made with a carbon dioxide gas laser.

3. The method according to claim 1, wherein, after the removal of the micro-via-hole-forming portion of the copper foil as the outermost layer with the carbon dioxide gas laser, the copper foil positioned below a copper foil as an outermost layer is removed partly in the thickness direction thereof with the carbon dioxide gas laser at an output of 20 to 35 mJ/pulse.

4. The method according to claim 1, wherein the first copper foil as the outermost layer, the copper foil in the bottom of the micro-via hole and a copper foil exposed on a wall surface of the micro-via hole are electrically connected through the micro-via hole.

5. The method according to claim 1, wherein a first copper foil as the outermost layer is surface-etched to remove the first copper foil partly in the thickness direction of the first copper foil and at the same time to remove a copper foil burr after making a micro via hole and removing the organic coating or sheet.

6. The method according to claim 5, wherein the first copper foil as the outermost layer is etched until it has a thickness of 3 to 7 μm.

7. The method according to claim 1, wherein the copper-clad laminate is a double-side copper-clad laminate or a multi-layered laminate.

8. The method according to claim 7, wherein the double-side copper-clad laminate comprises a substrate formed by impregnating an inorganic or organic woven or non-woven fabric with a thermosetting resin composition, either a dye or a pigment, and an inorganic insulating filler.

9. The method according to claim 8, wherein the thermosetting resin composition contains at lest one resin selected from the group consisting of an epoxy resin, a polyfunctional cyanate ester resin, a polyfunctional maleimide-cyanate ester resin, a polyfunctional maleimide resin, and an unsaturated-group-containing polyphenylene ether resin.

10. The method according to claim 1, wherein part of the copper foil surface in the bottom of the micro-via hole is removed and then an inside of the micro-via hole is treated in a gaseous phase to remove remaining resin layer, followed by wetting treatment.

11. The method according to claim 10, wherein the remaining resin is removed by the treatment in a gaseous phase and the wetting treatment.

12. The method according to claim 10, wherein the first copper foil as the outermost layer is etched before the treatment in a gaseous phase.

13. The method according to claim 10, wherein the treatment in a gaseous phase is plasma treatment or low-pressure ultraviolet light treatment.

14. The method according to claim 1, wherein the first copper foil and the copper foil layer in the bottom of the micro-via hole are electrically connected by filling at least 80% by volume of the micro-via hole with a copper plating.

15. The method according to claim 4, wherein the sheet of the organic substance is laminated on a first copper foil as the outermost layer under heat and under pressure.

16. The method according to claim 4, wherein the sheet of the organic substance is wetted 3 μm or less deep before the sheet is laminated on a first copper foil.

* * * * *